United States Patent
Eberhardt

(10) Patent No.: US 6,246,327 B1
(45) Date of Patent: *Jun. 12, 2001

(54) RADIO FREQUENCY IDENTIFICATION TAG CIRCUIT CHIP HAVING PRINTED INTERCONNECTION PADS

(75) Inventor: Noel H. Eberhardt, Cupertino, CA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/393,097

(22) Filed: Sep. 9, 1999

Related U.S. Application Data

(63) Continuation-in-part of application No. 09/115,279, filed on Jul. 14, 1998, now Pat. No. 6,091,332, and a continuation-in-part of application No. 09/103,226, filed on Jun. 23, 1998, now Pat. No. 6,018,299, and a continuation-in-part of application No. 09/094,261, filed on Jun. 9, 1998, now Pat. No. 6,107,920.

(60) Provisional application No. 60/099,913, filed on Sep. 11, 1998.

(51) Int. Cl.⁷ .................................................. G08B 13/14
(52) U.S. Cl. .................... 340/572.1; 257/758; 340/572.7
(58) Field of Search ............................ 340/572.1, 572.7; 257/758, 773, 774

(56) References Cited

U.S. PATENT DOCUMENTS

| | | | |
|---|---|---|---|
| 3,843,036 | 10/1974 | Monahan et al. ................ | 29/740 X |
| 4,783,646 | 11/1988 | Matsuzaki ................... | 340/572.5 X |
| 4,900,386 | 2/1990 | Richter-Jorgensen ......... | 340/572.1 X |
| 4,970,495 | 11/1990 | Matsumoto et al. .............. | 340/572.1 |
| 5,081,445 | 1/1992 | Gill et al. ........................... | 340/572.1 |
| 5,175,418 | 12/1992 | Tanaka ................... | 235/439 |
| 5,288,235 | 2/1994 | Sobhani ............... | 29/846 X |
| 5,430,441 | 7/1995 | Bickley et al. ............... | 340/572.7 X |
| 5,528,222 | 6/1996 | Moskowitz et al. ............. | 340/572.7 |
| 5,566,441 | 10/1996 | Marsh et al. ............. | 29/600 |
| 5,682,143 | 10/1997 | Brady et al. ................. | 340/572.7 |
| 5,710,458 | 1/1998 | Iwaski ........................ | 340/572.7 X |
| 5,786,626 | 7/1998 | Brady et al. .................. | 257/673 |
| 5,847,447 | 12/1998 | Rozin et al. ................... | 257/678 |
| 5,850,187 | 12/1998 | Carrender et al. ............. | 340/10.6 |
| 5,854,480 | 12/1998 | Noto ............................... | 235/492 |
| 6,001,211 | 12/1999 | Hiroyuki ................... | 235/492 X |
| 6,018,299 | * 1/2000 | Eberhardt ........................ | 340/572.7 |
| 6,084,303 | * 7/2000 | Audoux et al. .................... | 257/758 |
| 6,091,332 | * 7/2000 | Eberhardt et al. ................ | 340/572.1 |
| 6,107,920 | * 8/2000 | Eberhardt et al. ................ | 340/572.7 |

FOREIGN PATENT DOCUMENTS

| | | |
|---|---|---|
| 40 17 934 C2 | 1/1992 | (DE) . |
| 0 245 196 A2 | 11/1987 | (EP) . |
| 0 260 221 A2 | 3/1988 | (EP) . |
| 0 260 221 A3 | 3/1988 | (EP) . |

\* cited by examiner

Primary Examiner—Thomas Mullen
(74) Attorney, Agent, or Firm—Terri S. Hughes

(57) ABSTRACT

A radio frequency identification tag circuit chip (10) includes a circuit chip (11) having a surface (18) and at least one interconnection pad (12, 14) formed in the surface (18). A layer (24) of insulating material is deposited on the surface and about the at least one interconnection pad (12, 14), and a layer of conductive material (26) is deposited on the insulating material and coupling to the interconnection pad (12, 14).

33 Claims, 3 Drawing Sheets

RADIO FREQUENCY IDENTIFICATION TAG CIRCUIT CHIP HAVING PRINTED INTERCONNECTION PADS

CROSS-REFERENCE TO RELATED APPLICATIONS

The applicant hereby claims the priority benefit of prior provisional application Ser. No. 60/099,913 filed Sep. 11, 1998, by Noel H. Eberhardt, the same inventor as the present application. The present application is a continuation-in-part of prior U.S. application Ser. No. 09/094,261, titled "Radio Frequency Identification Tag Having an Article Integrated Antenna" and filed on Jun. 9, 1998, now U.S. Pat. No. 6,107,920 which application is hereby incorporated by reference, and priority thereto for common subject matter is hereby claimed. The present application is a continuation-in-part of prior U.S. application Ser. No. 09/103,226, titled "Radio Frequency Identification Tag Having A Printed Antenna and Method" and filed on Jun. 23, 1998, now U.S. Pat. No. 6,018,299, which application is hereby incorporated by reference, and priority thereto for common subject matter is hereby claimed. The present application is a continuation-in-part of prior U.S. application Ser. No. 09/115,279, titled "Radio Frequency Identification Tag Having an Article Integrated Antenna" and filed on Jul. 14, 1998, now U.S. Pat. No. 6,091,332, which application is hereby incorporated by reference, and priority thereto for common subject matter is hereby claimed.

FIELD OF THE INVENTION

The present invention relates generally to radio frequency identification tags and radio frequency identification tag circuit chips including, but not limited to, radio frequency identification tag circuit chips having printed interconnection pads.

BACKGROUND OF THE INVENTION

Radio frequency identification tags and radio frequency identification tag systems are known, and find numerous uses. For example, radio frequency identification tags are frequently used for personal identification in automated gate sentry applications protecting secured buildings or areas. Information stored on the radio frequency identification tag identifies the person seeking access to the secured building. A radio frequency identification tag system conveniently provides for reading the information from the radio frequency identification tag at a small distance using radio frequency (RF) data transmission technology. Most typically, the user simply holds or places the radio frequency identification tag near a base station that transmits an excitation signal to the radio frequency identification tag powering circuitry contained on the radio frequency identification tag. The circuitry, responsive to the excitation signal, communicates the stored information from the radio frequency identification tag to the base station, which receives and decodes the information.

In general, radio frequency identification tags are capable of retaining and, in operation, transmitting a substantial amount of information—sufficient information to uniquely identify individuals, packages, inventory and the like. The radio frequency identification tag is also capable of receiving and storing information. In a read/write application, the base station is not only capable of sending an excitation signal and receiving a response from the radio frequency identification tag, but it is also capable of sending a data, or write, signal to the radio frequency identification tag. The radio frequency identification tag receives the write signal, which may contain data to be stored within the tag, a code or a command. Depending on the type of write signal, the radio frequency identification tag responds accordingly, such as by storing the data or acting upon the command.

To couple either the inductive or electrostatic signals between the base station and the radio frequency identification tag, the tag necessarily includes an antenna having at least one and frequently two antenna elements. Typically, a tag circuit chip and the antenna are electrically coupled and bonded to a tag substrate. The tag may also include additional components, for example, resistors, capacitors, inductors, etc. that must also be electrically coupled to the tag circuit chip and/or the antenna. Conventional tag design provides conductive traces formed on a substrate with the tag circuit chip, components and antenna bonded to the substrate and electrically coupled to the conductive traces. Wire bonding is a common technique for providing an electrical couple between the interconnection pads on the tag circuit chip and/or the component and the conductive traces. Alternatively, "flip" chip technology provides raised conductive regions ("bumped pads") on the tag circuit chip (and similarly on the electrical components). The "flip" chip, during assembly, is inverted and positioned to the substrate with the bumped pads aligning with and electrically coupling to the conductive traces. A conductive adhesive may be used between the bumped pads and the conductive traces to ensure a good electrical couple as well as to supplement the mechanical adhesion of the tag circuit chip to the substrate.

As will be readily appreciated, larger interconnection pads on the tag circuit chip provide more area for coupling between the tag circuit chip and the conductive traces. Additionally, larger interconnection pads on the tag circuit chip makes aligning the tag circuit chip with the conductive traces easier. However, large interconnection pads are expensive. For example, using photomasks, plating (whether electrode or electrode-less) and similar metalization techniques to form larger interconnection pads can range in cost from $50 to $150 per chip wafer. This equates to a cost of about 2–5 cents per tag circuit chip when separated from the wafer.

In a number of radio frequency identification tag applications, the radio frequency identification tag is designed as a single use, disposable device. For example, in electronic article surveillance applications, a radio frequency identification tag is attached to and remains with each item in inventory being tracked. Hundreds of millions of items are tracked using electronic article surveillance technology in shops, stores and warehouses around the world. It is also proposed to use radio frequency identification tag technology in mail and package delivery tracking applications. The United States Postal Service alone handles over 600 million pieces of mail each day. At even the lowest estimate of approximately 2 cents per radio frequency identification tag circuit chip, increasing the size of the interconnection pads using known plating techniques is excessively cost prohibitive.

Thus there is a need for an improved radio frequency identification tag circuit chip.

DETAILED DESCRIPTION OF THE PREFERRED EMBODIMENTS

Figure 1:
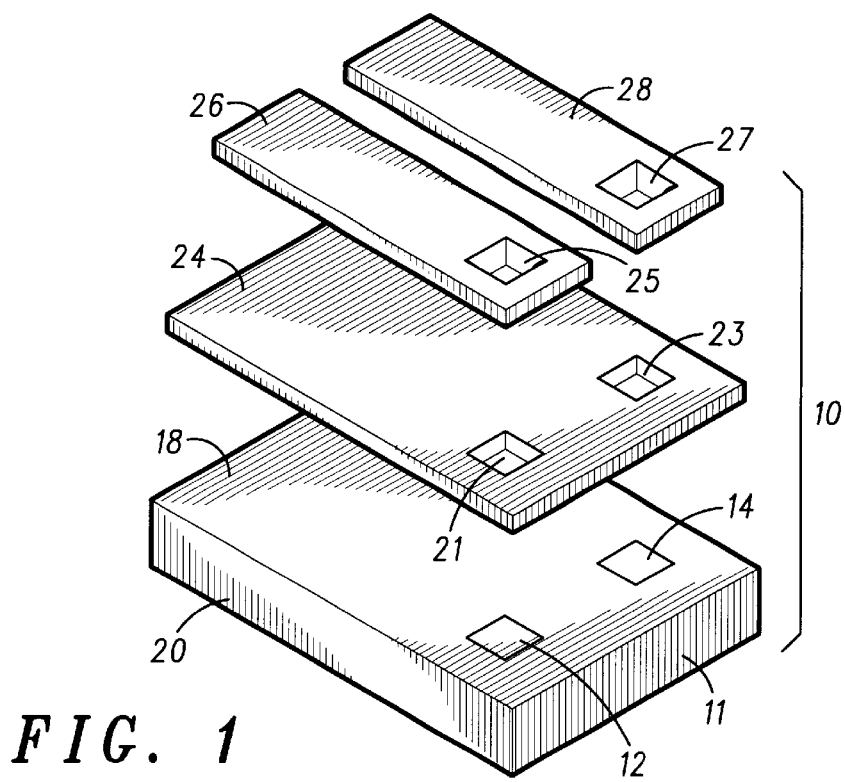
FIG. 1 is a perspective view in exploded assembly of a radio frequency identification tag circuit chip in accordance with a preferred embodiment of the present invention.
Figure 2:
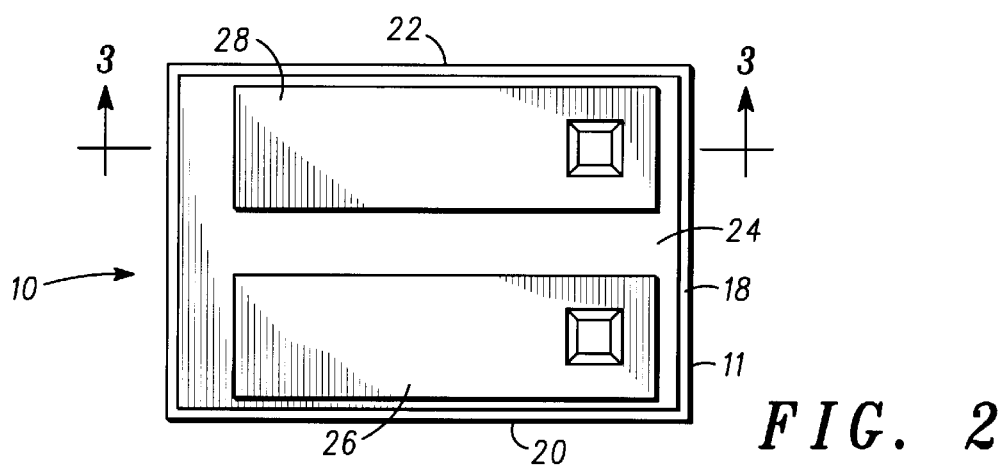
FIG. 2 is a plan view of the radio frequency identification tag circuit chip shown in FIG. 1.
Figure 3:
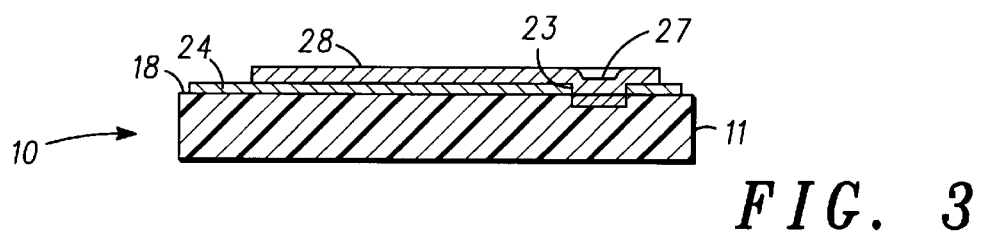
FIG. 3 is a cross-section view taken along line 3—3 of FIG. 2.

In accordance with preferred embodiments of the present invention, and with reference to FIG. 1, FIG. 2 and FIG. 3, a radio frequency identification tag circuit chip 10 is constructed from a circuit chip 11 manufactured in accordance with known techniques from a silicon wafer. Circuit chip 11 is further formed to include at least one interconnection pad, and a first interconnection pad 12 and a second interconnection pad 14 are shown. First interconnection pad 12 and second interconnection pad 14 are formed substantially co-planar with a surface 18. It will be appreciated that first interconnection pad 12 and second interconnection pad 14 may be formed recessed into or protruding from surface 18 without departing from the fair scope of the present invention. Circuit chip 11 further includes at least one side surface, and a first side surface 20 and a second side surface 22, preferably oriented substantially perpendicular to surface 18 are shown.

With continued reference to FIG. 1, FIG. 2 and FIG. 3, a layer 24 of insulating material is deposited on surface 18 and about first interconnection pad 12 and second interconnection pad 14. That is, layer 24 is formed with a first aperture 21 and a second aperture 23 surrounding first interconnection pad 12 and second interconnection pad 14, respectively. In this manner, layer 24 substantially covers surface 18 while leaving first interconnection pad 12 and second interconnection pad 14 exposed. Layer 24 may be formed in separate layers spaced apart on surface 18, and/or multiple layers respectively applied onto surface 18. Preferably, layer 24 is print deposited onto surface 18 using screen, stencil, pad transfer or similar printing techniques. Layer 24 is preferably formed from a material selected from the group of materials including a non-conductive polymer, a non-conductive ink and a non-conductive adhesive.

Deposited on layer 24 is at least one layer of conductive material, and a first layer 26 of conductive material and a second layer 28 of conductive material are shown deposited on layer 24. First layer 26 includes a portion 25 extending into aperture 21 and coupling to first interconnection pad 12. First layer 26 also extends over layer 24 for virtually the entire length of circuit chip 11. Similarly, layer 28 includes a portion 27 extending into aperture 23 and coupling to second interconnection pad 14. Second layer 28 too extends over layer 24 for virtually the entire length of circuit chip 11. Preferably, the conductive material forming layer 26 and layer 28 is a material selected from the group of materials including conductive ink, conductive polymer and conductive adhesive, and is print deposited on layer 24 using screen, stencil, pad transfer or similar printing techniques. One of ordinary skill in the art will appreciate that virtually any precision printing technique may be used without departing from the fair scope of the present invention. One will also appreciate that layer 24 need be only as large as to ensure that first layer 26 and second layer 28 may be formed insulated from circuit chip 11.

It should be understood that certain applications may not require insulating layer 24 and in these applications it may be omitted. At least one insulating layer is discussed with respect to each of the preferred embodiments described herein. The insulating layer is preferred in that it provides at least two advantages. Firstly, insulating layer 24 elevates the first layer 26 and second layer 28 away from the circuit chip 11 so as to minimize capacitive coupling therebetween. Secondly, insulating layer 24 provides an additional barrier minimizing the chance of shorting first layer 26 or second layer 28 to circuit chip 11.

First layer 26 and second layer 28 define at least one printed interconnection pad on circuit chip 11, and correspond, respectively, to a first printed interconnection pad and a second printed interconnection pad. Moreover, first layer 26 and second layer 28 form enlarged, as compared to interconnection pad 12 and interconnection pad 14, interconnection pads on circuit chip 11 for coupling, for example, to a radio frequency identification tag antenna. It is contemplated that a greater than 20:1 increase in interconnection pad area may be obtained using the present invention. It is estimated that the increase in interconnection pad area may be obtained at less than 1 cent per circuit chip.

Figure 4:
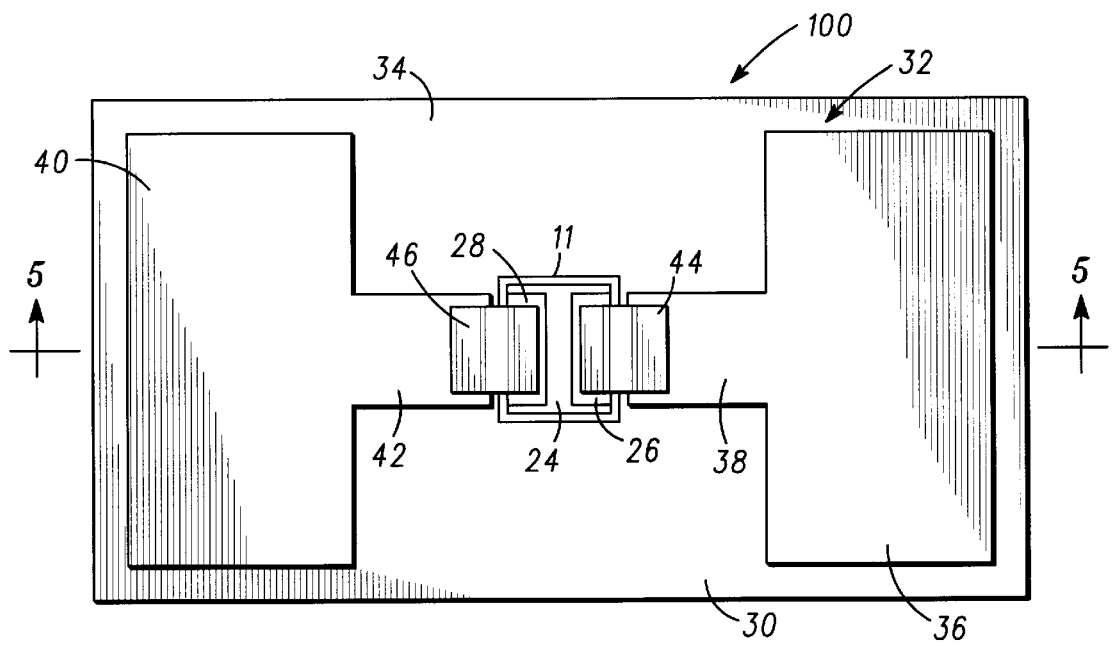
FIG. 4 is a plan view of a radio frequency identification tag incorporating a radio frequency identification tag circuit chip in accordance with a preferred embodiment of the present invention.
Figure 5:
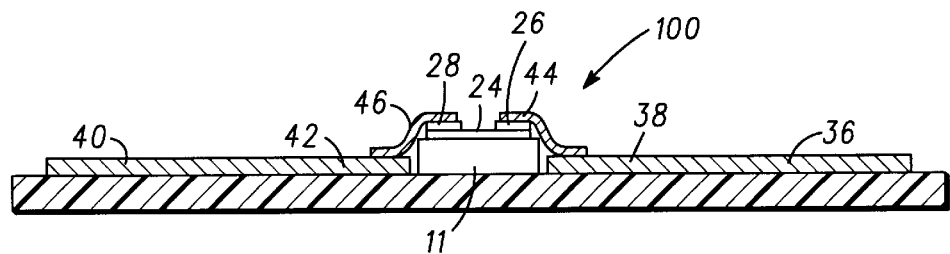
FIG. 5 is a cross-section view taken along line 5—5 of FIG. 4.

With reference now to FIG. 4 and FIG. 5, a radio frequency identification tag 100 includes a substrate 30 formed to include an antenna 32 on a surface 34 thereof. As shown, antenna 32 includes a first antenna element 36 including a first coupling region 38 and a second antenna element 40 including a second coupling region 42. It will be appreciated that antenna 32 may be formed as a coil antenna with first and second leads without departing from the fair scope of the present invention. Radio frequency identification tag circuit chip 11 is secured to surface 34 and positioned between first coupling region 38 and second coupling region 42.

As best seen in FIG. 5, first layer 26 is coupled to first coupling region 38 via a layer 44 of conductive material, and similarly, second layer 28 is coupled to second coupling region 42 by a layer 46 of conductive material. Each of layer 44 and layer 46 is preferably formed using printing techniques as disclosed and described in the aforementioned United States Patent Application entitled "Radio Frequency Identification Tag Having Printed Circuit Interconnections."

As noted, because printing techniques are used to form first layer 26 and second layer 28, each may be formed at substantially less cost than forming enlarged metalized interconnection pads on circuit chip 11 using photomask, plating and similar technologies. It is believed that first layer 26 and second layer 28 may be formed at a cost of less than 1 cent per circuit chip. Thus a substantial increase in interconnection pad area is obtained at a substantial cost reduction when compared to using existing technologies to form enlarged metalized pads.

Figure 6:
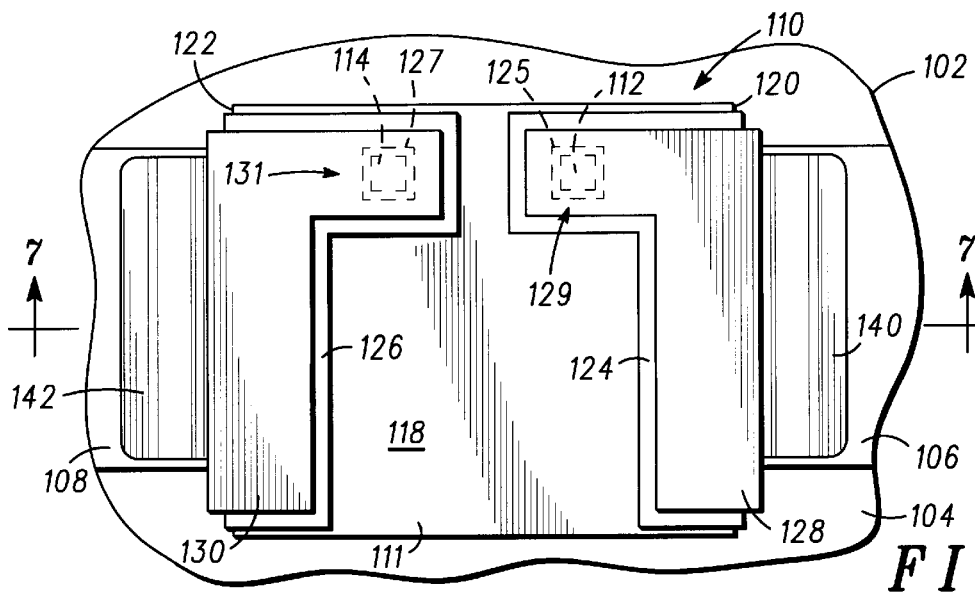
FIG. 6 is a plan view of a portion radio frequency identification tag incorporating a radio frequency identification tag circuit chip in accordance with another alternate preferred embodiment of the present invention.
Figure 7:
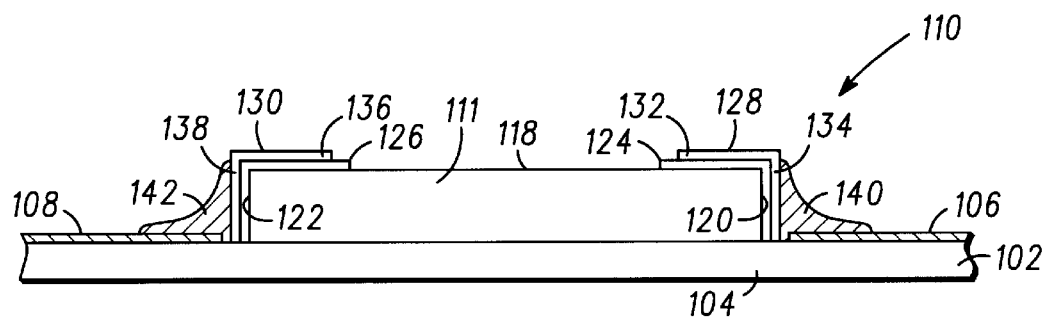
FIG. 7 is a cross-section view taken along line 7—7 of FIG. 6.

An alternate preferred radio frequency identification tag circuit chip 110 is shown in FIG. 6 and FIG. 7 in association with a portion of a radio frequency identification tag 102. Radio frequency identification tag 102 is of similar construction as radio frequency identification tag 100 and includes an antenna formed on a substrate 104. The antenna includes one or more antenna elements, and as shown, further includes a first coupling region 106 and second coupling region 108.

Radio frequency identification tag circuit chip 110 is secured to substrate 104 and between coupling region 106 and coupling region 108. Radio frequency identification tag circuit chip 110 includes a circuit chip 111 formed to include a first interconnection pad 112 and a second interconnection pad 114 on a surface 118 thereof. Circuit chip 111 further includes a first side surface 120 and a second side surface 122, arranged substantially perpendicular to surface 118. A first insulating layer 124, including an aperture 125 surrounding first interconnection pad 112 is formed on circuit chip 111. First insulating layer 124 extends over surface 118 and down first side surface 120 for substantially the entire length of circuit chip 111. Similarly, a second insulating layer 126, including an aperture 127 surrounding second interconnection pad 114 are formed on radio frequency identification tag circuit chip 110. Second insulating layer 126 extends over surface 118 and down second side surface 122 for substantially the entire length of circuit chip 111.

Formed on each of first insulating layer 124 and second insulating layer 126 is a first layer 128 of conductive material and a second layer 130 of conductive material. First layer 128 includes a portion 129 extending through aperture 125 and coupling to first interconnection pad 112. First layer 128 also includes a portion 132 covering first insulating layer 124 over surface 118 and a portion 134 extending over first side surface 120. Second layer 130 includes a portion 131 extending through aperture 127 and coupling to second interconnection pad 114. Second layer similarly includes a portion 136 covering second insulating layer 126 over surface 118 and a portion 138 extending over second side surface 122.

As best seen in FIG. 7, with radio frequency identification tag circuit chip 110 secured to substrate 104, portion 134 and portion 138 are aligned adjacent to first coupling region 106 and second coupling region 108, respectively. A layer 140 of conductive material and a layer 142 of conductive material are printed deposited and respectively coupling portion 134 with first coupling region 106 and portion 138 with second coupling region 108. In this manner, radio frequency identification tag circuit chip 110 is effectively, and efficiently, coupled to the antenna formed on substrate 104.

Figure 8:
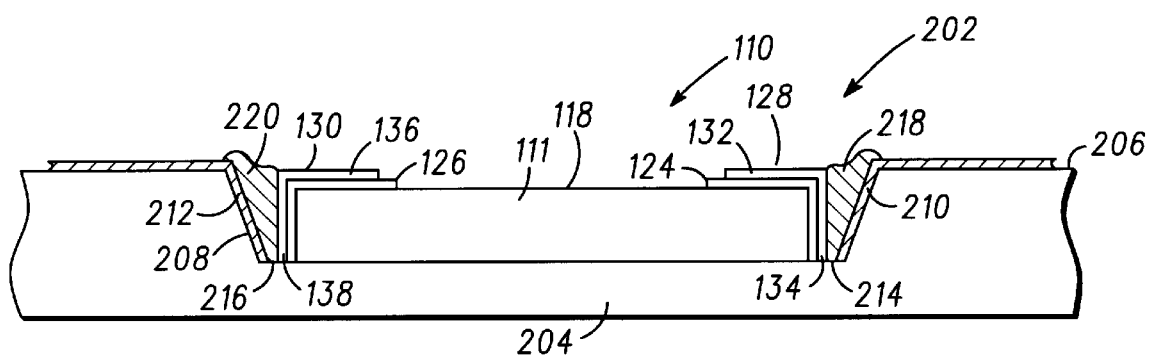
FIG. 8 is a cross-section view, similar to FIG. 7, and illustrating a portion of a radio frequency identification tag according to an alternate preferred arrangement of the present invention.

With reference now to FIG. 8, radio frequency identification tag circuit chip 110 is shown coupled to a substrate 204 arranged in accordance with an alternate preferred embodiment. Substrate 204 includes a surface 206 upon which an antenna (not shown) is formed. Substrate 204 is formed to include a recess 208 into which radio frequency identification tag circuit chip 110 is secured. The antenna is formed to include a first coupling region 210 and a second coupling region 212. Each of first coupling region 210 and second coupling region 212 extend into recess 208 and adjacent to portion 134 and portion 138, respectively. A channel 214 and a channel 216 is thereby created between portion 134 and first coupling region 210 and between portion 138 and second coupling region 212, respectively. A layer 218 of conductive material and a layer 220 of conductive material is deposited into channel 214 and channel 216, respectively. Layer 218 couples portion 134 with first coupling region 210, and layer 220 couples portion 138 with second coupling region 212. A preferred conductive material includes one of the group of materials including conductive ink, conductive polymer and conductive adhesive. Conductive adhesive advantageously provides, in addition to electrical coupling of radio frequency identification tag circuit chip 110 to the antenna, added mechanical strength for retaining radio frequency identification tag circuit chip 110 in recess 208. Preferably recess 208 is also formed to a depth such that radio frequency identification tag circuit chip is disposed below surface 206 thus providing protection to radio frequency identification tag circuit chip 110 from becoming dislodged from substrate 204. Recess 208 also eliminates or reduces any bumps created by the circuit chip in a covering layer and reduces stress on the circuit chip during subsequent lamination procedures. Recess 208 is preferably formed by providing a localized compressed portion of substrate 204. Such a localized compressed portion may be formed by stamping or coining. Recess 208 may also be formed by providing a laminate secured to substrate 204 and the laminate formed to include an aperture.

In summary, and with reference to FIG. 1, FIG. 2 and FIG. 3, a radio frequency identification tag circuit chip 10 includes a circuit chip 11 having a surface 18 and at least one interconnection pad, shown as interconnection pad 12 and interconnection pad 14, formed in the surface 18. A layer 24 of insulating material is deposited on the surface and about the at least one interconnection pad, and a layer of conductive material 26 is deposited on the insulating material and coupling to the interconnection pad.

With reference to FIG. 4 and FIG. 5, a radio frequency identification tag 100 includes a radio frequency identification tag circuit chip 10 secured to a substrate 30. The substrate 30 is formed to include an antenna 32, and the radio frequency identification tag circuit chip 10 is formed to include at least one printed interconnection pad. The printed interconnection pad is a layer 26, 28 of conductive material print deposited on a surface 18 of a circuit chip 11 and coupling to an interconnection pad 12, 14 formed in the surface 18 and to the antenna 32.

With reference to FIG. 6 and FIG. 7, a radio frequency identification tag 102 includes a radio frequency identification tag circuit chip 110 secured to a substrate 104. The substrate 104 is formed to include an antenna, and the radio frequency identification tag circuit chip 110 is formed to include at least one printed interconnection pad. The printed interconnection pad is a layer 128, 130 of conductive material print deposited on a surface 118, 120, 122 of a circuit chip 111 and coupling to an interconnection pad 112, 114 formed on the circuit chip 111. The printed interconnection pad is further coupled to the antenna.

With reference to FIG. 8, a radio frequency identification tag 202 includes a radio frequency identification tag circuit chip 110 secured within a recess 208 formed in a substrate 204. The substrate 204 is formed to include an antenna, and the radio frequency identification tag circuit chip 110 is formed to include at least one printed interconnection pad. The printed interconnection pad is a layer 128, 130 of conductive material print deposited on a surface 118, 120, 122 of a circuit chip 111 and coupling to an interconnection pad 112, 114 formed on the circuit chip. The printed interconnection pad is further coupled to the antenna.

The printed interconnection pads provide a substantially larger coupling area for a radio frequency identification tag. Using printing techniques and conductive ink, conductive polymer or conductive adhesive advantageously allows the area of the interconnection pad to be increased without substantially increasing the cost of the circuit chip. In comparison, printed interconnection pads formed in accordance with the preferred embodiments of the present invention may be formed for less than about 1 cent per circuit chip.

The larger printed interconnection pads, as compared to metalized pads produced using known technologies, also simplify the manufacturing process. The larger pads are easily aligned with, for example, antenna elements formed on a substrate material.

Many additional changes and modifications could be made to the invention without departing from the fair scope and spirit thereof. The scope of some changes is discussed above. The scope of others will become apparent from the appended claims.

What is claimed is:

1. A radio frequency identification tag circuit chip comprising:
    a circuit chip having a surface and at least one interconnection pad formed in the surface; and
    a layer of conductive material substantially larger than the at least one interconnection pad and deposited on the surface and coupling to the at least one interconnection pad,
    wherein the circuit chip is secured to a substrate, the substrate is formed to include an antenna, and the antenna is coupled to the layer of conductive material.

2. The radio frequency identification tag circuit chip of claim 1, further comprising a layer of insulating material deposited between the surface and the layer of conducting material.

3. The radio frequency identification tag circuit chip of claim 2, wherein the layer of conductive material is printed on the layer of insulating material.

4. The radio frequency identification tag circuit chip of claim 2, wherein the layer of insulating material comprises one of a non-conductive polymer, a non-conductive ink, and a non-conductive adhesive.

5. The radio frequency identification tag circuit chip of claim 2, wherein the layer of insulating material is printed on the surface and the layer of conductive material is printed on the layer of insulating material.

6. The radio frequency identification tag circuit chip of claim 1, wherein the conductive material comprises one of a conductive ink, a conductive polymer and a conductive adhesive.

7. The radio frequency identification tag circuit chip of claim 1, wherein the surface further comprising a side surface of the circuit chip.

8. The radio frequency identification tag circuit chip of claim 1, further comprising a conductive adhesive coupling the conductive material to the antenna.

9. A radio frequency identification tag circuit chip comprising:
    a circuit chip having a first interconnection pad and a second interconnection pad;
    a layer of insulating material disposed on a surface of the circuit chip, the layer of insulating material formed to include a first aperture and a second aperture, the first aperture and the second aperture arranged to expose the first interconnection pad and the second interconnection pad through the layer of insulating material;
    a first layer of conductive material disposed on the layer of insulating material and coupling to the first interconnection pad; and
    a second layer of conductive material disposed on the layer of insulating material and coupling to the second interconnection pad,
    wherein the surface comprises a first side surface and a second side surface, and wherein the layer of insulating material comprises a first layer of insulating material disposed on the first side surface and a second layer of insulating material disposed on the second side surface.

10. The radio frequency identification tag circuit chip of claim 9, wherein the layer of insulating material is printed on the surface.

11. The radio frequency identification tag circuit chip of claim 9, wherein the first layer of conductive material and the second layer of conductive material are printed on the layer of insulating material.

12. The radio frequency identification tag circuit chip of claim 9, wherein the first layer of conductive material is disposed on the first layer of insulating material and the second layer of conductive material is disposed on the second layer of insulating material.

13. The radio frequency identification tag circuit chip of claim 9, wherein the conductive material comprises one of a conductive ink, conductive polymer and a conductive adhesive.

14. The radio frequency identification tag circuit chip of claim 9, wherein the insulating material comprises one of a non-conductive polymer, a non-conductive ink, and a non-conductive adhesive.

15. A radio frequency identification tag circuit chip comprising:
    a circuit chip having a first interconnection pad and a second interconnection pad:
    a layer of insulating material disposed on a surface of the circuit chip, the layer of insulating material formed to include a first aperture and a second aperture, the first aperture and the second aperture arranged to expose the first interconnection pad and the second interconnection pad through the layer of insulating material;
    a first layer of conductive material disposed on the layer of insulating material and coupling to the first interconnection pad; and
    a second layer of conductive material disposed on the layer of insulating material and coupling to the second interconnection pad,
    wherein the circuit chip is secured to a substrate, the substrate is formed to include an antenna including a first coupling region and a second coupling region, and the first layer of conductive material is coupled to the first coupling region and the second layer of conductive material is coupled to the second coupling region.

16. The radio frequency identification tag circuit chip of claim 15, further comprising a conductive adhesive coupling the first layer of conductive material and the second layer of conductive material.

17. A radio frequency identification tag comprising:
    a substrate, the substrate including an antenna formed on a surface thereof; and
    a radio frequency identification tag circuit chip secured to the substrate, the radio frequency identification tag circuit chip formed with at least one printed interconnection pad and the at least one printed interconnection pad coupling the radio frequency identification tag circuit chip to the antenna.

18. The radio frequency identification tag of claim 17, wherein the at least one printed interconnection pad comprises a layer of conductive material printed on a surface of a circuit chip and coupling to an interconnection pad formed on the surface.

19. The radio frequency identification tag of claim 18, wherein the at least one printed interconnection pad comprises a layer of insulating material disposed between the layer of conductive material and the surface.

20. The radio frequency identification tag of claim 19, wherein the insulating material is printed on the surface.

21. The radio frequency identification tag of claim 18, wherein the conductive material comprises one of a conductive ink, a conductive polymer and a conductive adhesive.

22. The radio frequency identification tag of claim 18, wherein the surface further comprises a side surface of the circuit chip.

23. The radio frequency identification tag of claim 18, further comprising a layer of conductive material coupling the at least one printed interconnection pad and the antenna.

24. The radio frequency identification tag of claim 17, wherein the substrate includes a recess and the radio frequency identification tag circuit chip is disposed within the recess.

25. A radio frequency identification tag comprising:
- a substrate, the substrate including a recess formed on a surface thereof and an antenna formed on the surface thereof; and
- a radio frequency identification tag circuit chip disposed in the recess and secured to the substrate, the radio frequency identification tag circuit chip formed with at least one printed interconnection pad and wherein the at least one printed interconnection pad couples the radio frequency identification tag circuit chip to the antenna.

26. The radio frequency identification tag of claim 25, wherein the at least one printed interconnection pad comprises a layer of conductive material printed on a surface of a circuit chip and coupling to an interconnection pad formed on the surface.

27. The radio frequency identification tag of claim 26, wherein the at least one printed interconnection pad comprises a layer of insulating material disposed between the layer of conductive material and the surface.

28. The radio frequency identification tag of claim 27, wherein the insulating material is printed on the surface.

29. The radio frequency identification tag of claim 26, wherein the conductive material comprises one of a conductive ink, a conductive polymer and a conductive adhesive.

30. The radio frequency identification tag of claim 26, wherein the surface further comprises a side surface of the circuit chip.

31. The radio frequency identification tag of claim 26, further comprising a layer of conductive material coupling the at least one printed interconnection pad and the antenna.

32. The radio frequency identification tag of claim 25, wherein the recess comprises a localized compressed portion of the substrate.

33. The radio frequency identification tag of claim 25, wherein the recess comprises an aperture formed in a laminate secured to the substrate.

* * * * *